United States Patent
Mangrum et al.

(10) Patent No.: US 9,917,039 B2
(45) Date of Patent: Mar. 13, 2018

(54) METHOD OF FORMING A SEMICONDUCTOR PACKAGE WITH CONDUCTIVE INTERCONNECT FRAME AND STRUCTURE

(71) Applicant: Amkor Technology Inc., Tempe, AZ (US)

(72) Inventors: Marc Alan Mangrum, Manchaca, TX (US); Thinh Van Pham, Austin, TX (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/134,330

(22) Filed: Apr. 20, 2016

(65) Prior Publication Data

US 2017/0309554 A1    Oct. 26, 2017

(51) Int. Cl.
| | |
|---|---|
| *H01L 21/00* | (2006.01) |
| *H01L 23/495* | (2006.01) |
| *H01L 21/48* | (2006.01) |
| *H01L 27/092* | (2006.01) |

(52) U.S. Cl.
CPC .... *H01L 23/49562* (2013.01); *H01L 21/4825* (2013.01); *H01L 21/4828* (2013.01); *H01L 23/4952* (2013.01); *H01L 23/49551* (2013.01); *H01L 27/0922* (2013.01)

(58) Field of Classification Search
CPC ............. H01L 27/0922; H01L 21/4828; H01L 23/49551; H01L 23/4952; H01L 21/4825; H01L 23/49562
See application file for complete search history.

(56) References Cited

U.S. PATENT DOCUMENTS

| | | | |
|---|---|---|---|
| 2007/0114676 A1* | 5/2007 | Anderson | H01L 23/3107 257/787 |
| 2008/0054420 A1* | 3/2008 | Quah | H01L 21/4842 257/676 |
| 2010/0000772 A1* | 1/2010 | Letterman, Jr. | H01L 21/561 174/260 |
| 2014/0240945 A1 | 8/2014 | Hosseini et al. | |

* cited by examiner

*Primary Examiner* — Thanh Y Tran
(74) *Attorney, Agent, or Firm* — Kevin B. Jackson

(57) ABSTRACT

A method of forming a packaged semiconductor device includes providing a conductive frame structure. The conductive frame structure includes a first frame having leadfingers configured for directly attaching to a semiconductor device, such as an integrated power semiconductor device that includes both power devices and logic type devices. The leadfingers are further configured to provide high current capacity and a high thermal dissipation capacity for the power device portion of the semiconductor device. In one embodiment, the conductive frame structure further includes a second frame joined to the first frame. The second frame includes a plurality of leads configured to electrically connect to low power device portions of the semiconductor device. A package body is formed to encapsulate the semiconductor device and at least portions of the leadfingers and leads.

16 Claims, 8 Drawing Sheets

US 9,917,039 B2

METHOD OF FORMING A SEMICONDUCTOR PACKAGE WITH CONDUCTIVE INTERCONNECT FRAME AND STRUCTURE

CROSS-REFERENCE TO RELATED APPLICATIONS

Not Applicable.

BACKGROUND OF THE DISCLOSURE

The present invention relates, in general, to electronics, and more particularly, to semiconductor packages, structures thereof, and methods of forming semiconductor packages.

In the past, packaged power semiconductor devices utilized various conductive interconnect techniques to electrically connect a power semiconductor die to conductive leads of a packaged device. In discrete power semiconductor devices, such as discrete insulated-gate field effect transistor (IGFET) semiconductor devices, manufacturers have utilized conductive ribbons and bonded wire or wirebond interconnects (including multiple wirebonds per electrode) for connecting current carrying electrodes on the power semiconductor device to the conductive leads of the package. However, these types of interconnects have not been able to provide sufficient current carrying capability as required in certain higher power devices. As an alternative interconnect structure, manufacturers have used larger sized conductive clips as a replacement to ribbons and wirebonds to connect current carrying electrodes on the power semiconductor device to the conductive leads of the package.

On the other hand, in highly integrated power semiconductor designs where power semiconductor devices, such as IGFET devices, are integrated with complementary metal-oxide semiconductor ("CMOS") logic circuits on a single chip, the lead pitch of the bond pads and the size of the bond pad openings of these designs are not compatible with conductive clips. For example, integrated power semiconductor designs require multiple interconnects per IGFET that use tighter bond pad pitches ("BPP") and tighter bond pad openings ("BPO"), which have exceeded the capabilities of past clip designs and clip placement equipment. Additionally, conductive ribbons and wirebonds (including larger diameter wires) have not provided satisfactory alternative interconnect solutions for highly integrated power semiconductor designs because of reduced current carrying capability and higher resistance.

Accordingly, it is desirable to have a structure and a method of forming a packaged semiconductor device that addresses the issues noted previously as well as others. It is also desirable for the structure and method to accommodate different types of conductive interconnects within the same packaged device, to be easily incorporated into manufacturing flows, and to be cost effective.

Figure 1:
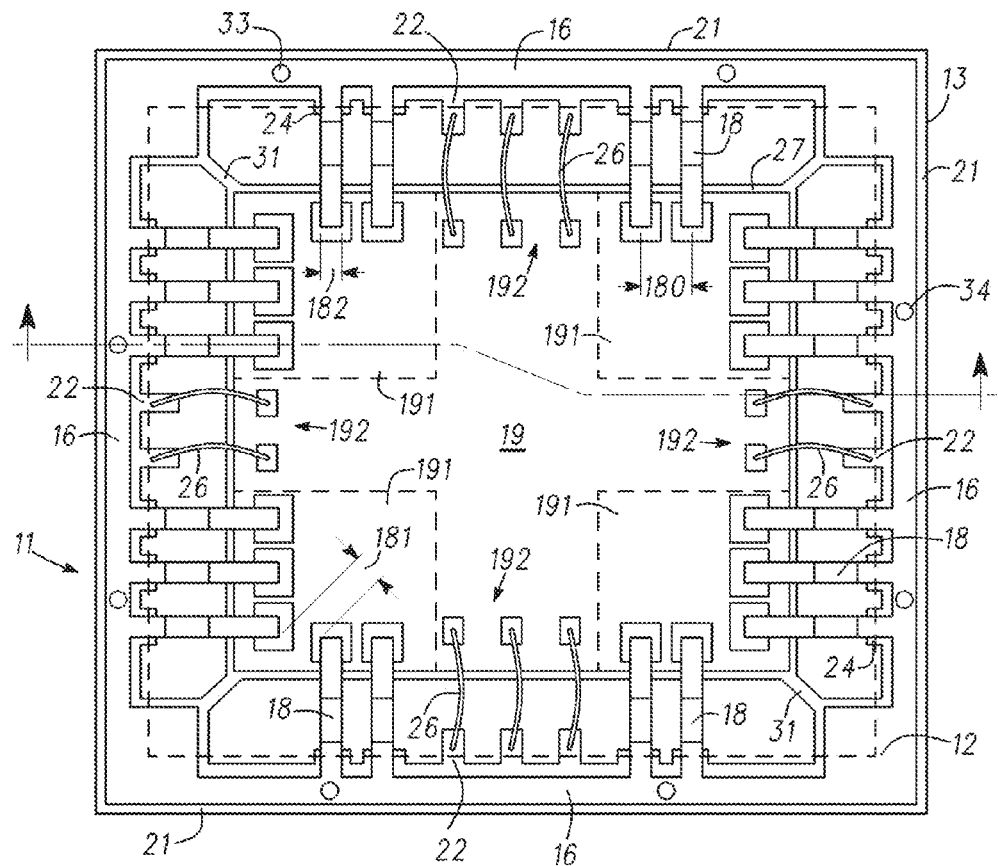
FIG. 1 illustrates a top view of a semiconductor package in accordance with an embodiment of the present invention.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, a method of manufacturing a semiconductor device package using a conductive frame structure that includes a conductive leadfinger configured to directly attach to a semiconductor device. The leadfinger is configured to increase current carrying capacity and improve thermal performance when attached to a power semiconductor device or power device portion, which can be integrated with other lower power semiconductor devices on a single chip. In some embodiments, the conductive frame structure includes additional leads that may be electrically coupled to the other lower power semiconductor devices using, for example, conductive wire structures. The leadfingers are shaped to facilitate direct attachment to the semiconductor device. In some embodiments, the leadfingers comprise a bent shape having one or more bends. In other embodiments, the leadfingers comprise recessed portions, such as half-etched portions.

The conductive frame structure can include more or more frame elements with side segments supporting the leadfingers and leads. The side segments are removed during manufacturing and may further includes stress relief features and/or alignment features to enhance manufacturability of the semiconductor device package. The conductive frame structure supports assembly with semiconductor devices having finer pitch bond pads and complex power and logic layout configurations. The present embodiments enable direct leadfinger attachment to a semiconductor die while at the same time providing for other types of interconnect structures, such as wire bond interconnects. In one embodiment, the top or first frame is used for forming the leadfinger interconnects having thicker and wider dimensional characteristics compared to previous structures is attached to the leads of a bottom or second frame, which forms the final packaged device lead line or external lead profile.

More particularly, in one embodiment, a method of making a semiconductor device comprises providing a conductive frame structure. The conductive frame comprises a first frame having a first side segment and a leadfinger extending inward from the first side segment and a second frame having a second side segment and a first lead extending inward from the second side segment. The method includes providing a semiconductor device having a major surface, the major surface including a first conductive structure and a second conductive structure. The method includes placing the leadfinger and the first conductive structure into contact to provide an electrical connection. The method includes attaching a conductive connective structure to the second conductive structure and the first lead. The method includes forming a package body covering the conductive connective structure, at least portions of the leadfinger, at least a portion of the first lead, and at least a portion of the semiconductor device. The method includes removing the first side segment and the second side segment.

In another embodiment, a method for forming a packaged semiconductor device comprises providing a conductive frame structure comprising a leadfinger extending inward from the first side segment and a first lead, wherein the leadfinger comprises a leadfinger top surface having a first top surface segment and a second top surface segment, the first top surface segment residing on a different plane than the second top surface segment. The method includes providing a semiconductor device having a major surface, the major surface including a first conductive structure and a second conductive structure. The method includes attaching the leadfinger to the first conductive structure. The method includes attaching a conductive connective structure to the second conductive structure and the first lead. The method includes forming a package body encapsulating the conductive connective structure, at least portions of the leadfinger, at least portions of the first lead, and at least a portion of the semiconductor device. The method includes removing the first side segment.

In a further embodiment, a packaged semiconductor device comprises a die attach pad and a leadfinger having a first leadfinger end, a second leadfinger end opposite to the first leadfinger end, and a leadfinger top surface having a first top surface segment residing on a first plane and a second top surface segment residing on a second plane, wherein the first plane is different than the second plane. A first lead is spaced apart from the die attach pad and further attached to the first lead finger end. A second lead spaced apart from the die attach pad. A semiconductor device includes a first conductive structure and a second conductive structure, wherein the second leadfinger end is directly attached to the first conductive structure. A conductive connective structure is attached to the second lead and the second conductive pad. A package body covers or encapsulates the conductive connective structure, at least portions of the leadfinger, at least portions of the first lead, and at least portions of the second lead.

Figure 2:
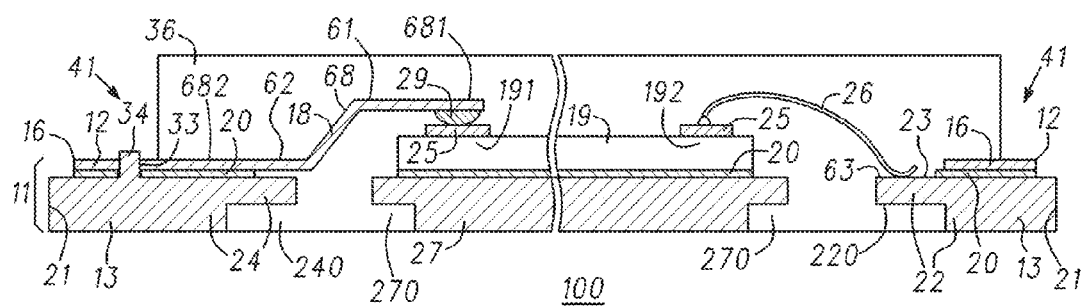
FIG. 2 illustrates a cross-sectional view of the semiconductor package of FIG. 1 taken along reference line 2-2.

FIG. 1 illustrates a top view of a semiconductor package 100 or packaged semiconductor device 100 in accordance with a first embodiment of the present description. FIG. 2 illustrates a cross-sectional view of semiconductor package 100 taken along reference line 2-2 of FIG. 1. In accordance with the present embodiment, semiconductor package 100 includes a conductive frame structure 11. In one embodiment, conductive frame structure 11 comprises a multiple frame structure (i.e., more than one frame) including a top frame 12 or first frame 12 stacked on top of or stacked adjacent to a bottom frame 13 or second frame 13. In other embodiments, which will be described later, conductive frame structure 11 can comprise a single frame that includes some or all of the features or elements described hereinafter.

In one embodiment, top frame 12 comprises a conductive material. In one embodiment, top frame 12 is mainly composed of copper and is approximately 100 µm through 508 µm in thickness. In one preferred embodiment, top frame 12 has a thickness of approximately 150 µm through 155 µm. In other embodiments, top frame 12 can be mainly composed of Fe—Ni (e.g., Alloy 42) or any other metal material as known to those of skill in the art. Top frame 12 can be formed or manufactured using masking and etch techniques, stamping techniques, bending or forming techniques, plating techniques, deposition techniques, machining, and/or combinations thereof. Top frame 12 includes multiple side segments 16, and in one embodiment, top frame 12 includes four side segments 16 composed in a square-frame configuration as generally illustrated, for example, in FIG. 1. In other embodiments, top frame 12 comprises a matrix of frame structures for assembling a plurality of semiconductor devices that are subsequently separated into individual devices. It is understood that top frame 12 may have other shapes including additional side segments greater than four.

In accordance with the present embodiment, top frame 12 further includes one or more leadfingers 18 or conductive finger structures 18 disposed extending inward from one or more of side segments 16. In accordance with the present embodiment, leadfingers 18 are disposed on locations of side segments 16 corresponding to where leadfingers 18 will connect to power device portion(s) 191 of a semiconductor device 19 or semiconductor die 19. In one embodiment, each side segment 16 includes at least one leadfinger 18 configured to bond or attach directly to semiconductor device 19.

In some embodiments, leadfingers 18 are preferably formed having as close to full leadframe thickness as possible in order to maximize current capacity and to maximize thermal performance for semiconductor package 100. In some embodiments, leadfingers 18 are formed using photolithographic masking and etching techniques in order to provide optimized pitch between adjoining leadfingers 18 while enabling tighter features with more consistent results and enabling a reduction in metal stringers and undercutting of leadfingers 18. In some embodiments, leadfingers 18 are formed having a pitch 180 of approximately 100 µm to 300 µm with a leadfinger width 182 of approximately 40 µm to 100 µm while maintaining a corner radius 181 or minimum inner lead pitch 181 of approximately 100 µm to 160 µm. In one preferred embodiment, pitch 180 is approximately 200 µm with leadfinger width 182 of approximately 60 µm while maintaining corner radius 181 of approximately 150 µm.

In one embodiment, bottom frame 13 comprises a conductive material. In one embodiment, bottom frame 13 is mainly composed of copper and is approximately 100 µm through 250 µm in thickness. In some embodiment, bottom frame 13 has a different thickness than top frame 12. In one embodiment, bottom frame 13 has a full frame thickness that is greater than the full frame thickness of top frame 12. In other embodiments, bottom frame 13 can be mainly composed of Fe—Ni (e.g., Alloy 42) or any other metal material as known to those of skill in the art. Bottom frame 13 can be formed or manufactured using masking and etch techniques, stamping techniques, bending or forming techniques, plating techniques, deposition techniques, machining techniques, and/or combinations thereof. In other embodiments, bottom frame 13 comprises a matrix of frames for assembling a plurality of semiconductor devices that are subsequently separated into individual devices.

Bottom frame 13 includes multiple side segments 21, and in one embodiment, bottom frame 13 includes four side segments 21 composed in a square-frame configuration as generally illustrated, for example, in FIG. 1. In accordance with the present embodiment, bottom frame 13 further includes one or more leads 22 or conductive leads 22 disposed extending inward from one or more of side segments 21. In accordance with the present embodiment, leads 22 are disposed on locations of side segments 21 corresponding to where conductive connective structures 26 will connect to low power device portion(s) 192 of semiconductor device 19. That is, those portions of semiconductor device 19 that do not require the high current capacity and high thermal capacity of leadfingers 18.

In one embodiment, each side segment 21 includes at least one lead 22. In some embodiments, bottom frame 13 further includes support leads 24 or conductive support leads 24 disposed extending inward from side segments 21 and further adjoining lower surfaces of leadfingers 18 when top frame 12 is attached or engaged with bottom frame 13 to advantageously provide support for leadfingers 18. Also, support leads 24 increase the amount of conductive material associated with leadfingers 18, thus improving the current capacity and thermal performance of semiconductor package 100. In one embodiment, support leads 24 and leads 22 have substantially the same shape and size so that support leads 24 can alternatively function as package leads when, for example, embodiments of top frame 12 have fewer leadfingers 18 thereby increasing the number of leads 22/24 for connecting to low power portions 192 of semiconductor device 19.

In some embodiments, bottom frame 13 further includes a die pad 27 or die attach structure 27 centrally disposed within bottom frame 13 and spaced apart from side segments 21. In one embodiment, one or more lifting leads 31 or tie bars 31 are used to secure die pad 27 to bottom frame 13. In one embodiment, peripheral side segments 270 of die pad 27 and inner edges segments 240 and 220 of support leads 24 and leads 22 have a recessed or half-etched configuration as generally illustrated in FIG. 2, which provides, for example, increased locking capability of leads 22/24 and die attach pad 27 to the molded package body to be described later.

In one embodiment, semiconductor die 19 is attached to die pad 27 using a die attach material 20. By way of example, die attach material 20 can be a solder paste, a conductive epoxy, conductive adhesives, conductive films, non-conductive epoxy, non-conductive adhesives, non-conductive films, or other suitable attach materials as known to those of skill in the art. In one embodiment, after semiconductor die 19 is attached to die pad 27, conductive connective structures 26 or conductive structures 26 are attached to bond pads 25, conductive structures 25, or conductive pads 25 disposed adjacent a major surface of semiconductor die 19 corresponding a low power device portion 192 of semiconductor 19. In some embodiments, low power device portions 192 correspond to logic type semiconductor devices or similar devices that do not have high current and/or high thermal dissipation requirements. In one embodiment, conductive connective structures 26 are conductive wires, such as gold, silver, copper, aluminum, combinations or alloys thereof, or other suitable wires formed using wire bonding techniques. In other embodiments, conductive connective structures 26 are conductive ribbons or other suitable conductive interconnects comprising one or more conductive materials, such as gold, silver, copper, aluminum, combinations or alloys thereof, or other suitable materials. In an alternative embodiment, conductive connective structures 26 are provided after top frame 12 is attached to bottom frame 13 and leadfingers 18 are directly attached to other bond pads 25 on semiconductor die 19 corresponding to power device portions 191 of semiconductor device 19. In one preferred embodiment, those areas where leadfingers 18 will directly attach to bond pads 25 on semiconductor die 19 include a conductive joining material 29, such as a solder paste or a pre-tinned solder material.

Top frame 12 can be attached to bottom frame 13 using, for example, die attach material 20. In one embodiment, one or both of top frame 12 and bottom frame 13 can be pre-tinned with solder or another suitable conductive material such as a sintering agent or high thermal conductive epoxy. In one embodiment, top frame 12 is joined to bottom frame 13 prior to electrically connecting the bond pads 25 in low power device portions 192 of semiconductor device 19 to leads 22. In some embodiments, this enables consistent clamping at the wire bonding step to prevent bouncing and to ensure the various components are still aligned. Also, in some embodiment this also improves the molding process because top frame 12 and bottom frame 13 behave as a contiguous structure ensuring proper mold clamping while minimizing manufacturing issues, such as mold flash and warpage.

In accordance with one embodiment, top frame 12 and bottom frame 13 further comprise alignment features 33 and 34 to ensure proper alignment between the frames and to semiconductor device 19. Also, alignment features 33 and 34 enable the stacking of top frame 12 and bottom frame 13 in an automated manner. This minimizes manufacturing issues while ensuring the two frames align better when connected or stacked together. In the present embodiment, alignment feature 33 comprises an opening or hole extending through side segments 16 of top frame 12, and alignment feature 34 comprises a bump or protrusion portion extending upward from side segments 21 and disposed within the opening as generally illustrated in FIG. 2. Other alignment feature embodiments are illustrated, for example, in FIGS. 3, 4, 5, and 6 and will be described later.

In one embodiment, semiconductor package 100 further includes a package body 36 that covers or encapsulates conductive connective structure 26, at least portions of leadfingers 18, leads 22, support leads 24, die pad 27 and semiconductor die while leaving lower surfaces of leads 22, support leads 24 and/or die pad 27 exposed to the outside of semiconductor package 100 as generally illustrated in FIG. 2. In some embodiments, package body 36 can be polymer based composite material, such as epoxy resin with filler, epoxy acrylate with filler, or polymer with proper filler. Package body 36 comprises a non-conductive and environmentally protective material that protects semiconductor device 19 from external elements and contaminants. Package body 36 may be formed using paste printing, compressive molding, transfer molding, liquid encapsulant molding, vacuum lamination, other suitable applicator, or other processes as known to those of skill in the art. In some embodiments, package body 36 is an epoxy mold compound ("EMC") and can be formed using transfer or injection molding techniques. In other embodiments where, for example, die pad 27 is not used, the lower surface of semiconductor die 19 may be exposed through package body 36 to the outside.

In some embodiments, package body 36 is formed to leave singulation streets 41 free of material adjoining side segments or edge segments of package body 36, which leaves portions of conductive frame structure 11 exposed. This facilitates removing or singulating side segments 16 and 21 of conductive frame structure 11 to provide a singulated or separated semiconductor package 100. By way of example, a sawing process can be used for the removal step. It is understood that the removal process may also remove portions of leadfingers 18, portions of the leads 22, and portions of support leads 24 that are proximate to their respective edge segments 16/21. In other embodiments (see e.g., FIG. 13), package body 36 can be a continuous or overmolded body and the singulation process passes through a portion of package body 36 as well as side segments 16 and 21 to provide a singulated or separated semiconductor package 100. In accordance with one embodiment, leadfingers 18 include a leadfinger top surface 68 having a first top surface segment 681 and a second top surface segment 682 and the first top surface segment 681 resides on a different plane (e.g., a horizontal plane) than the second top surface segment 682. More particularly, first top surface segment 681 resides in a first plane 61 (e.g., a first horizontal plane) and second top surface segment 682 resides in a second plane 62 (e.g., a second horizontal plane) different than first plane 61. Additionally, lead 22 includes a lead top surface 23 that resides in a third plane 63 (e.g., a third horizontal plane), which is different than first plane 61 and second plane 62.

Figure 3:
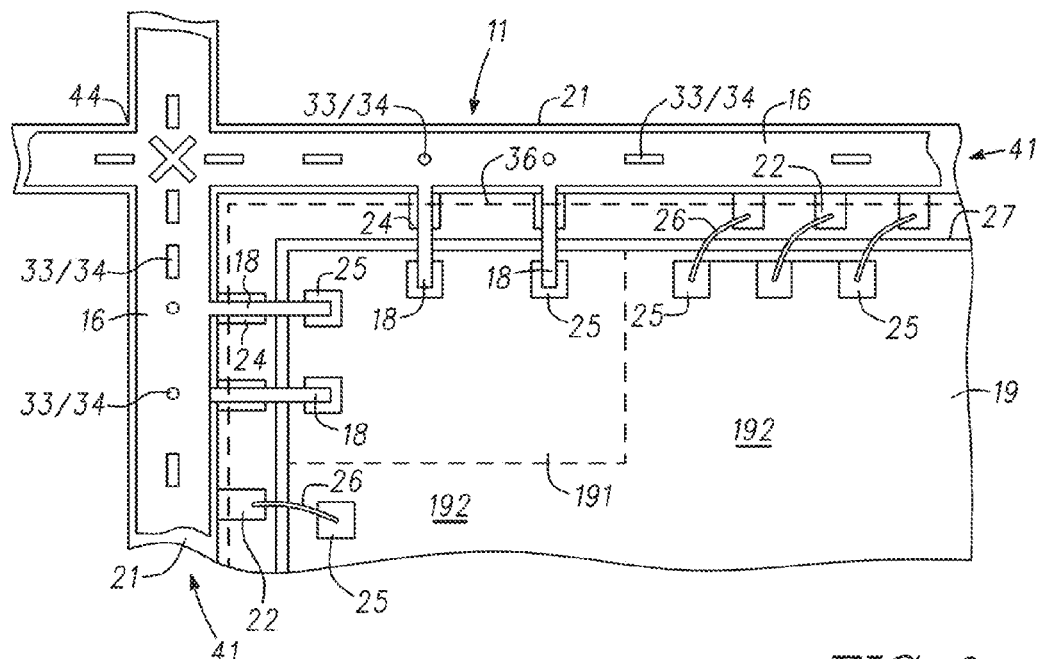
FIG. 3 illustrates an enlarged partial top view of the semiconductor package of FIG. 1 with additional features.

FIG. 3 illustrates an enlarged partial top view of semiconductor package 100 to further show some of the details of semiconductor package 100. In one embodiment, side segments 16 have a narrower width than side segments 21, and one or both of side segments 16 and 21 may further include one or more stress-relief features 44 disposed within frame structure 11 in regions where higher assembly stresses may occur. FIG. 3 further illustrates an embodiment where different shaped alignment features 33/34 are provided alongside segments 16 and 21 to facilitate the alignment of top frame 12 to bottom frame 13 and to semiconductor device 19. By way of example, alignment features 33 and 34 can include round protrusions and openings respectively or comprise rectangular protrusions and rectangular openings respectively. Openings, 33/34 may be holes or slots. It is understood that top frame 12 can have protrusion alignment features and bottom frame 13 can have hole-type alignment features, or both frames can have both openings and protrusions.

In FIG. 3, conductive frame 11 is configured for an integrated semiconductor device 19 having both power devices (for example, power device portion 191), such as power field-effect transistors, and logic circuitry (for example, low power device portion 192), such as a controller device for controlling the power field-effect transistors. FIG. 3 further illustrates support leads 24 providing structural support for leadfingers 18 or providing increased external bonding area for semiconductor package 100. FIG. 3 also illustrates leads 22 electrically connected to die pads 25 in low power device portions 192 of semiconductor device 19 with conductive connective structures 26. In accordance with the present embodiment, leadfingers 18 are shaped to directly attach to die pads 25 in power device portions 191 of semiconductor device 19. FIG. 3 further illustrates examples of the placement of singulation streets 41 for removing at least side segments 16 and 21.

Figure 4:
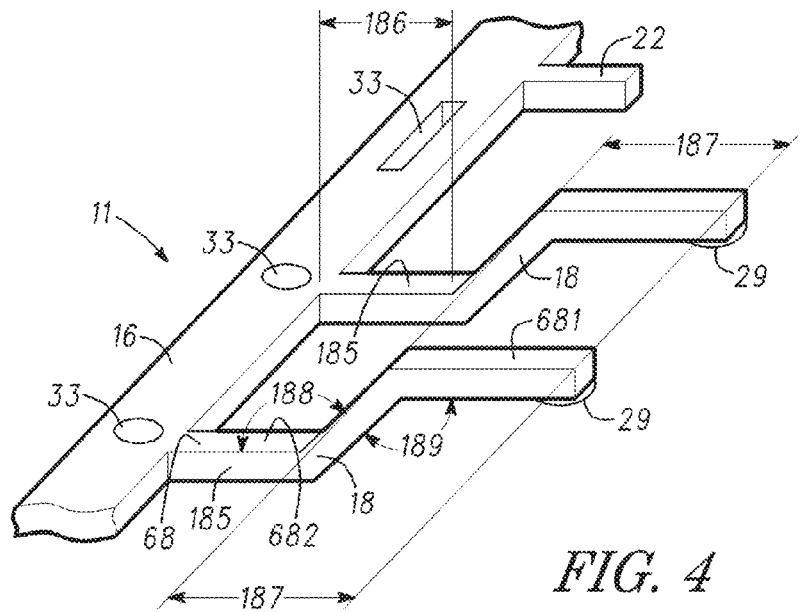
FIG. 4 illustrates a partial perspective view of a conductive frame structure in accordance with an embodiment of the present invention.

FIG. 4 illustrates a partial perspective view of conductive frame structure 11 in accordance with one embodiment. In FIG. 4, conductive frame 11 comprises top frame 12 and has leadfingers 18 extending inward from side segment 16, which has alignment features 33. In one embodiment, conductive frame structure 11 only includes top frame 12 (i.e., bottom frame 13 is not used) and portions 185 of leadfingers 18 are configured to be used to form the leads of semiconductor package 100. In addition, in this embodiment leads 22 are provided as part of side segment 16 as generally illustrated in FIG. 4. In one embodiment, leadfingers 18 are shaped or bent as illustrated in FIG. 4 for contacting bond pads 25 on semiconductor device 19. More particularly, leadfingers 18 include a leadfinger top surface 68 having a first top surface segment 681 and a second top surface segment 682 and the first top surface segment 681 resides on a different plane (e.g., a horizontal plane) than the second top surface segment 682. Dimensions 186 and 187 can be the same or different depending upon the particular application, and can be determined by, for example, the thickness of semiconductor device 19 and the location of die pads 25. In one embodiment angles 188 and 189 are formed such that leadfingers 18 comprise a 180 degree member, which ensures optimized bonding surface and reduces any effects of thermal coefficient of expansion mismatch between the material of conductive frame structure 11 and semiconductor device 19.

Figure 5:
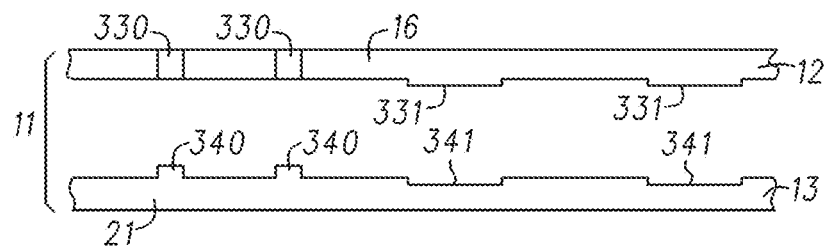
FIG. 5 illustrates a partial side view of a portion of a conductive frame structure in accordance with an embodiment of the present invention.

FIG. 5 illustrates a partial side view of conductive frame structure 11 showing an alternative embodiment of alignment features. In the embodiment illustrated, bottom frame 13 comprises pins 340 or protrusions 340 extending outward from a top surface of side segment 21 as well as one or more recesses 341 extending inward from the top surface of side segment 21. Top frame 12 comprises openings 330 or recesses 330 in side segment 16 corresponding to pins 340 and protrusion portions 331 extending outward from the bottom surface of side segment 16 corresponding to recesses 341.

Figure 6:
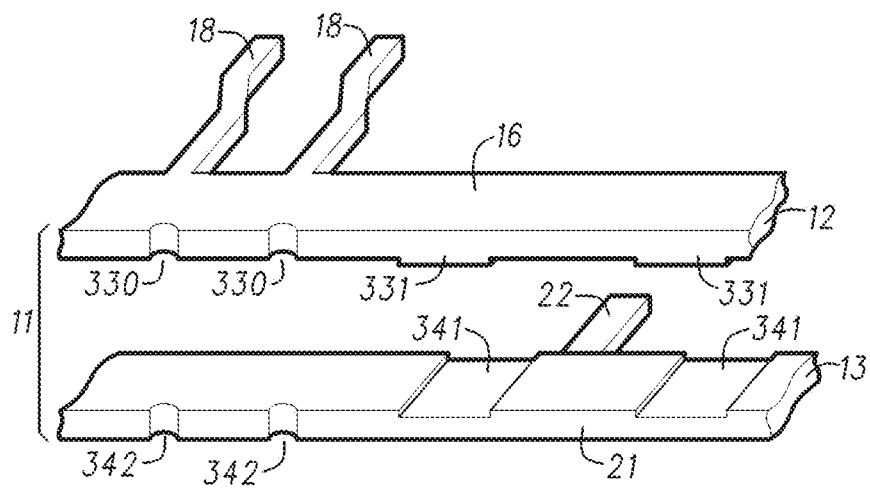
FIG. 6 illustrates a partial perspective view of a conductive frame structure in accordance with an embodiment of the present invention.

FIG. 6 illustrates a partial perspective view of a portion of conductive frame structure 11 in accordance with an alternative embodiment further illustrating leadfingers 18 extending from side segment 16. In this embodiment, bottom frame 13 comprises openings 342 instead of pins 340, which allows for external pins (not shown) as part of a jig structure configured to hold conductive frame structure 11 through openings 330 and 342 during fabrication, such as during the frame attach and reflow steps.

Figure 7:
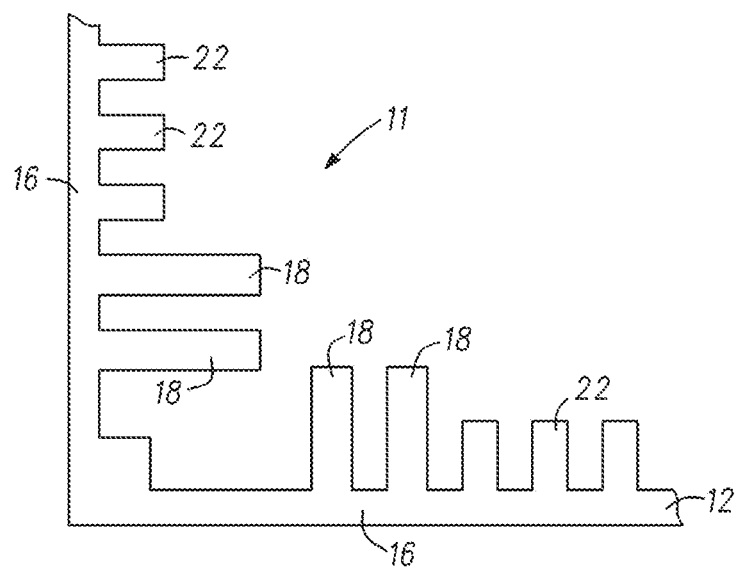
FIG. 7 illustrates a partial top view of a conductive frame structure in accordance with an embodiment of the present invention.

FIG. 7 illustrates a partial top view of conductive frame structure 11 in a configuration where only top frame 12 or a single frame 12 is used similar to the embodiment of FIG. 4. In this embodiment, leads 22 are provided as part of side segments 16 for electrically connecting to bond pads 25 in low power device portions 192 of semiconductor device 19. Additionally, leadfingers 18 may be bent as illustrated in FIG. 4 or configured having recessed portions as will be described later in conjunction with FIGS. 17-20.

Figure 8:
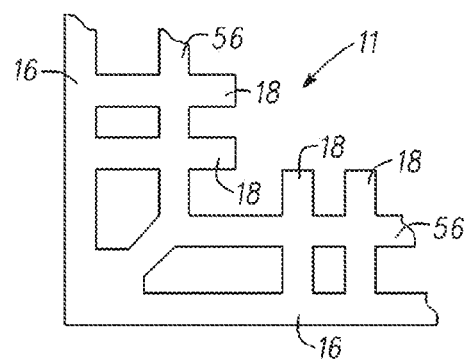
FIG. 8 illustrates a partial top view of a conductive frame structure in accordance with an embodiment of the present invention.

FIG. 8 illustrates a partial top view of conductive frame structure 11 in accordance with another embodiment. In this embodiment conductive frame structure 11, which can be top frame 12 in a single frame configuration or a multiple frame structure including top frame 12 and bottom frame 13, a tie bar structure 56 is provided to structurally tie adjoining leadfingers 18 together and to a corner portion of the leadframe. This provides additional support during assembly. Tie bar structure 56 is later removed during manufacturing.

Figure 9:
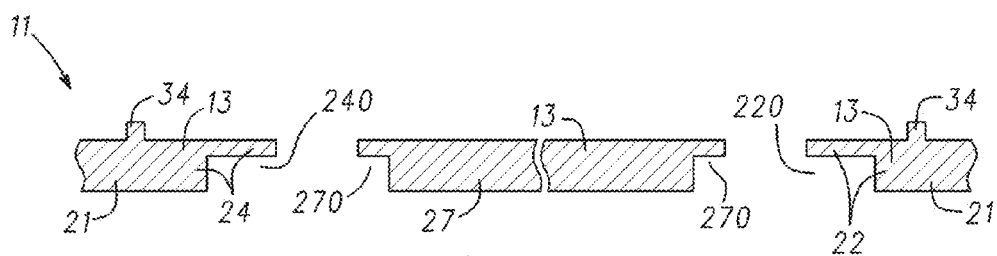
FIGS. 9-13 illustrate partial cross-sectional views of a packaged semiconductor device at various stages of assembly in accordance with an embodiment of the present invention.

Turning now to FIGS. 9-13, an example fabrication process for making semiconductor package 100 will be described in accordance with one embodiment. FIG. 9 illustrates a partial cross-sectional view of bottom frame 13 of conductive frame structure 11 at an early step in the fabrication process. In one embodiment, bottom frame 13 is a metal leadframe, such as a copper-based leadframe, having a plurality of side segments 21. Side segments 21 can have a rail-like shape and includes leads 22 extending inward from side segments 21 towards die pad 27. In some embodiments, support leads 24 are provided extending inwards from side segments 21 towards die pad 27. In the embodiment illustrated, bottom frame 13 further includes alignment features 34 comprising, for example, protrusions or pins extending outward from upper surfaces of side segments 21. In one embodiment, bottom frame 13 is formed using photolithographic masking and etching techniques to provide a fine pitch structure. In one embodiment, bottom frame 13 has a full-thickness in a range from approximately 100 μm through 508 μm. In one embodiment, die pad 27 has recessed portion 270 extending around its peripheral edges, leads 22 include recessed portions 220 on ends proximate to die pad 27, and support leads 24 include recessed portions 240 on ends proximate to die pad 27. It is understood that one or more additional metal layers (not shown) may be deposited on, for example, leads 22/24.

Figure 10:
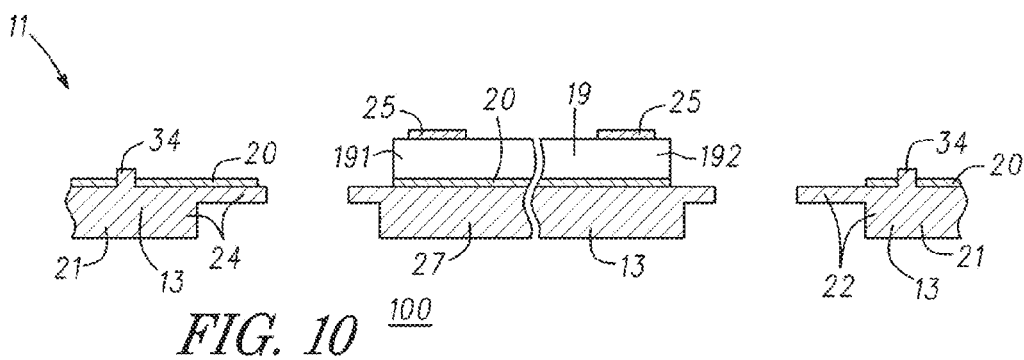

FIG. 10 illustrates an enlarged partial cross-sectional view of semiconductor package 100 after additional processing. In one embodiment, bottom frame 13 is subjected to a cleaning process, such as a plasma cleaning process. In one embodiment, die attach material 20 is deposited on the upper surface of die pad 27 and at least portions of the upper surface of bottom frame 13. In one embodiment, the upper surfaces of leads 22 are devoid of die attach material to allow for the later attachment of conductive connective structures 26. In one embodiment, die attach material 20 is placed on bottom frame 13 using a solder mask process. By way of example, die attach material 20 can be a solder paste, a conductive epoxy, conductive adhesives, or other suitable attach materials as known to those of skill in the art. In one embodiment, semiconductor device 19 is then attached to die pad 27. Semiconductor device 19 can be a discrete power device, an integrated circuit device, a sensor device, an optical device, an image sensor device, or other electronic devices as known to those of skill in the art. In the present embodiment, semiconductor device 19 comprises a power integrated circuit device having a power device portion 191, such a power IGFET portion, and a low power device portion 192, such as logic controller portion for controlling the power IGFET portion. In one embodiment, power device portion 191 comprises power semiconductor devices having high current carrying capability. Bond pads 25 are disposed on a major surface of semiconductor device 19 and can comprise a conductive material, such as one or more metal materials. Bond pads 25 are in electrical communication with power device portion 191 and low power device portion 192. In one embodiment, after semiconductor device 19 is attached, the sub-assembly may be subjected to a reflow process and then another cleaning step, such as a plasma cleaning step. In one embodiment, a solder mask (not shown) and a solder paste (not shown) may be applied to semiconductor device 19 as well as the bottom frame 13. The foregoing process may be performed in two separate manufacturing steps or may be combined into a single manufacturing step.

Figure 11:
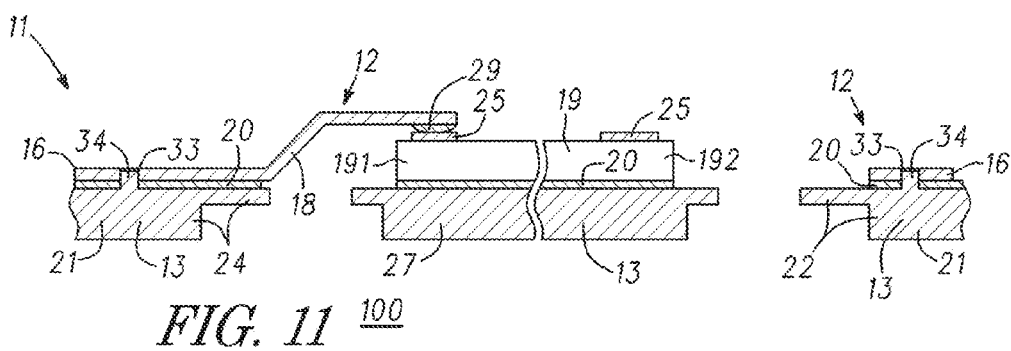

FIG. 11 illustrates an enlarged partial cross-sectional view of semiconductor package 100 after further processing. In accordance with the present embodiment, top frame 12 is provided and joined or attached to bottom frame 13 using die attach material 20. In one embodiment, top frame 12 can be cleaned using a plasma clean process prior to attaching top frame 12 to bottom frame 13. In accordance with present embodiment alignment features 33 and 34 function to align top frame 12 to bottom frame 13 and top frame 12 to semiconductor device 19. In accordance with the present embodiment, leadfingers 18 are configured to directly attach to bond pads 25 associated with power device portion 191 of semiconductor device 19. In one embodiment, the tips of leadfingers 18 facing bond pads 25 include conductive joining material 29 for attaching leadfingers 18 directly to semiconductor device 19. After top frame 12 is attached, the sub-assembly can be subjected to a reflow process to bond the sub-assembly together.

Figure 12:
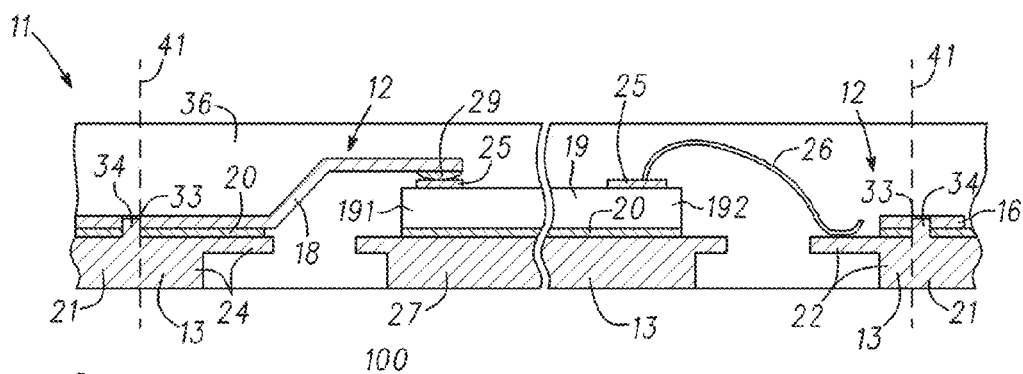

FIG. 12 illustrates an enlarged partial cross-sectional view of semiconductor package 100 after additional processing. In one embodiment, the sub-assembly can be cleaned using, for example, a plasma cleaning process. In one embodiment, conductive connective structures 26 are attached to bond pads 25 corresponding to low power device portions 192 of semiconductor device 19 and attached to leads 22 on conductive frame structure 11. In one embodiment, wire bonding techniques are used to attach conductive connective structures 26 to selected bond pads 25 and leads 22. In other embodiments, conductive ribbons or ribbon bonds can be used. In a subsequent step, the sub-assembly is placed into or within a molding apparatus, such as transfer molding apparatus or an injection molding apparatus, to form package body 36. In one embodiment, package body 36 comprises an overmolded package body as generally illustrated in FIG. 12. In other embodiments, package body 36 comprises a cavity molded package body (see for example, FIG. 2) that leaves portions of conductive frame structure 11 exposed for singulation. In one embodiment, a deflash process can be used after the molding process.

Figure 13:
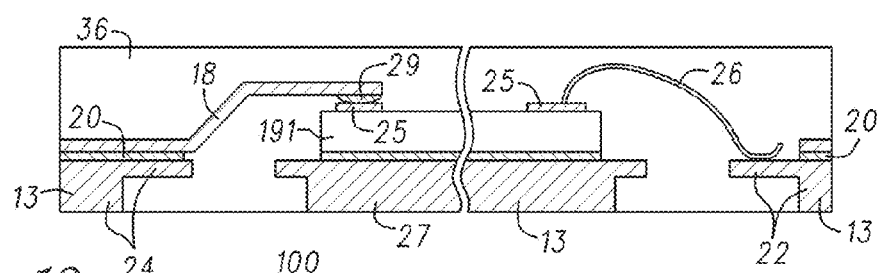

FIG. 13 illustrates an enlarged partial cross-sectional view of semiconductor package 100 after further processing. In one embodiment, portions of side segments 16 and 21 of conductive frame structure 11 are removed using a singulation process along singulation lines 41 shown, for example, in FIG. 12. In one embodiment, a sawing process can be uses for the singulation process. In other embodiment, other singulation processes can be used. In one embodiment, alignment features 33 and 34 are removed during the singulation process. In other embodiments, the alignment features remain in the final packaged device.

Figure 14:
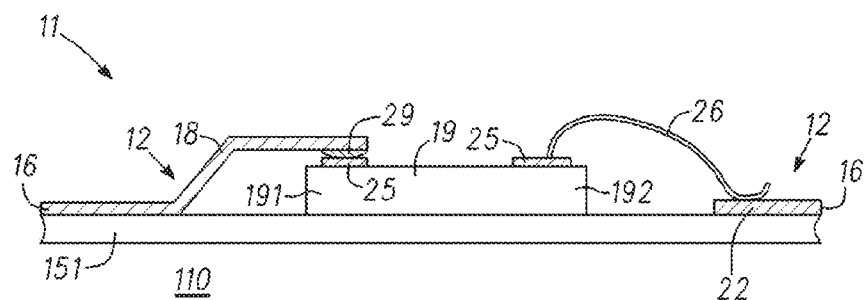
FIGS. 14-16 illustrate partial cross-sectional views of a packaged semiconductor device at various stages of assembly in accordance with another embodiment of the present invention.
Figure 15:
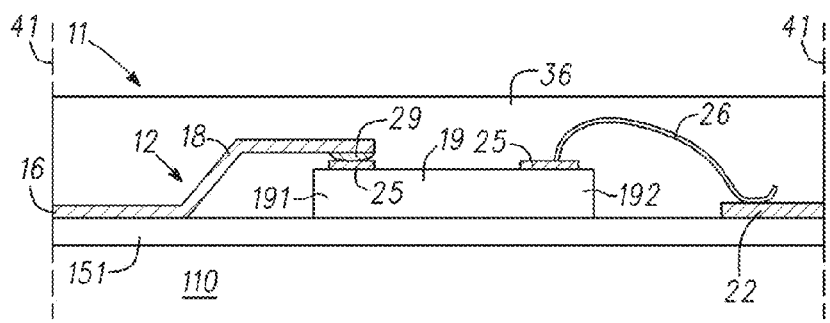
Figure 16:
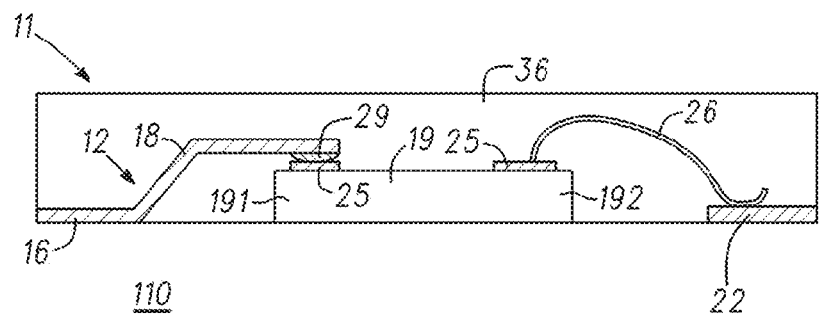

FIGS. 14-16 illustrate cross-sectional views of a packaged semiconductor device 110 or semiconductor package 110 at various stages of assembly in accordance with another embodiment. Semiconductor device package 110 includes some of the same features as semiconductor package device 100, and only the differences will be described hereinafter. FIG. 14 illustrates semiconductor package 110 at an earlier stage in fabrication with semiconductor device 19 attached to a carrier substrate 151. In accordance with one embodiment, carrier substrate 151 comprises an adhesive substrate, such as a carrier tape, or a substrate having a layer of adhesive on a surface for temporarily holding semiconductor device 19 and conductive frame structure 11 in place during manufacturing. In accordance with the present embodiment, conductive frame structure 11 includes only top frame 12 or single frame, which further includes leadfingers 18 extending inward from one or more side segments 16 and leads 22 extending inward from one or more side segments 16. In one embodiment, conductive frame structure 11 is attached to carrier substrate 151 such that leadfingers 18 are placed in direct contact with bond pads 25 corresponding to power device portion(s) 191 of semiconductor device 19. In one embodiment, the tips of leadfingers 18 facing bond pads 25 include conductive joining material 29 for attaching leadfingers 18 directly to semiconductor device 19. After top frame 12 is attached, the sub-assembly is subjected to a reflow process to bond leadfingers 18 to semiconductor device 19. Conductive connective structures 26 are then attached to bond pads 25 corresponding to low power device portion(s) 192 and leads 22. In one embodiment, wire bonding techniques are used to attach conductive connective structures 26 to selected bond pads 25 and leads 22. In other embodiments, ribbon bonds are used.

FIG. 15 illustrates a cross-sectional view of semiconductor package 110 after further processing. In one embodiment, the sub-assembly is placed into or within a molding apparatus, such as transfer molding apparatus or an injection molding apparatus, to form package body 36. In one embodiment, package body 36 comprises an overmolded package body as generally illustrated in FIG. 15. In other embodiments, package body 36 comprises a cavity molded package body that leaves portions of conductive frame structure 11 exposed for singulation. In one embodiment, a deflash process can be used after the molding process. In a subsequent step, the sub-assembly is singulated through side segments 16 of conductive frame 11 along singulation lines 41. Carrier substrate 151 is then removed in a subsequent step to expose lower surfaces of leadfingers 18, leads 22, and semiconductor device 19 to outside of semiconductor package 110 as illustrated in FIG. 16. In an alternative embodiment, carrier substrate 151 is removed before the singulation step.

Figure 17:
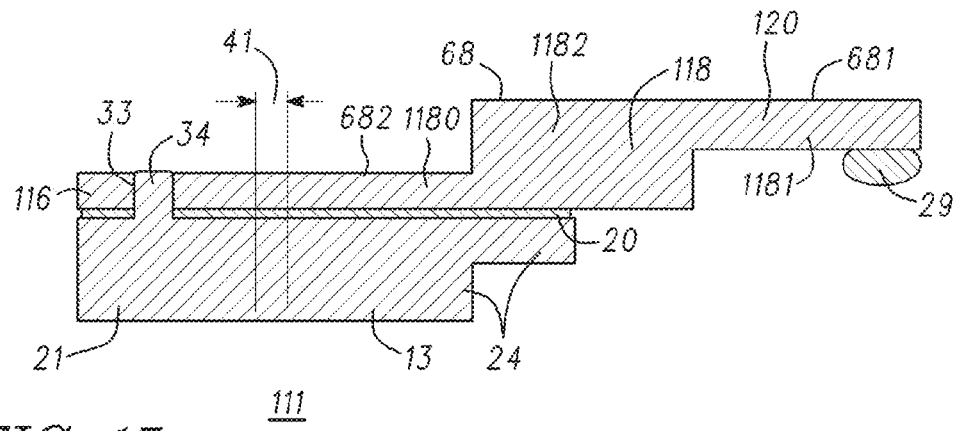
FIG. 17 illustrates a partial cross-sectional view of a conductive frame structure in accordance with an embodiment of the present invention.

FIG. 17 illustrates a partial cross-sectional view of a conductive frame structure 111 in accordance with another embodiment. Conductive frame structure 111 is another example of a structure having leadfingers 118 for directly connecting to semiconductor device 19. In one embodiment, conductive frame structure 111 includes bottom frame 13 having side segment 21, support lead 24, and alignment feature 34. In the present embodiment a top frame 120 includes one or more leadfingers 118, which comprise recessed portions 1180 and 1181 or half-etched portions 1180 and 1181. In one embodiment, leadfingers 118 include a full-thickness portion 1182 disposed between recessed portions 1180 and 1181 in cross-sectional view. Leadfingers 118 include a leadfinger top surface 68 having a first top surface segment 681 and a second top surface segment 682 and the first top surface segment 681 resides on a different plane (e.g., a horizontal plane) than the second top surface segment 682.

In one embodiment, recessed portion 1180 corresponds to a side segment 116 of top frame 120, and can be configured to include alignment feature 33. Recessed portion 1180 has the benefit of reducing the metal thickness in that portion of semiconductor package 130 (illustrated in FIG. 18) that will be singulated or separated thereby reducing wear of the singulating tool. Additionally, this minimizes any premature separation of the frames during singulation and minimizes the opportunities for micro-cracking type defects. Similar to previous embodiments, top frame 120 is joined or attached to bottom frame 13 using die attach material 20. In accordance with the present embodiment, leadfingers 118 having recessed portion 1181 are configured to directly attach to semiconductor device 19. In some embodiments, the tip portion of recessed portion 1181 is provided with conductive joining material 29 for directly attaching to semiconductor device 19. Recessed portions 1180 and 1181 can be formed using, for example, masking and etching techniques and/or stamping techniques or other techniques as known to those of skill in the art. Conductive frame structure 111 is suitable for use with, for example, embodiments where die attach pad 27 is of the same thickness as bottom frame 13, which places semiconductor device 19 higher than bottom frame 13 and the lower package leads. Singulation street 41 is an example of where conductive frame structure 111, or more particularly, where side segments 21 and 116 can be singulated or separated after the formation of package body 36.

Figure 18:
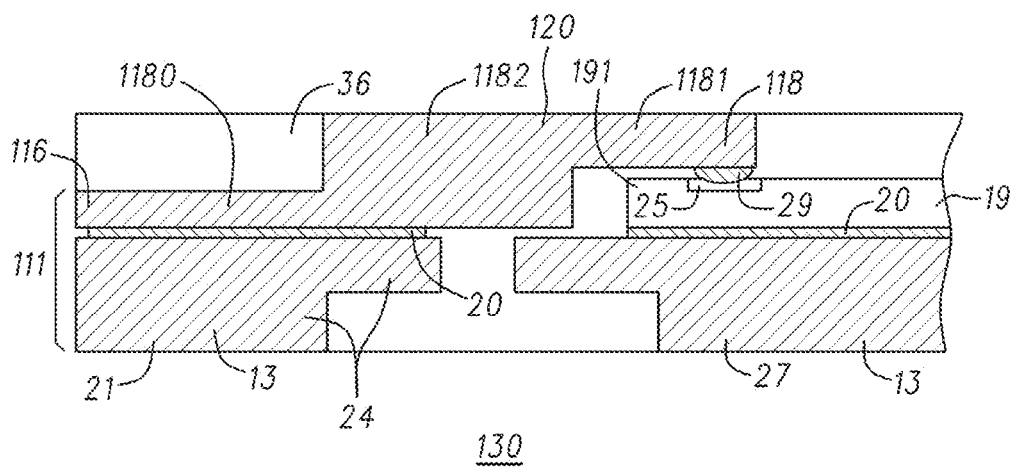
FIG. 18 illustrates a partial cross-sectional view of the conductive frame structure of FIG. 17 in an embodiment of a semiconductor package in accordance with the present invention.

FIG. 18 illustrates a partial cross-sectional view of the conductive frame structure 111 in an embodiment of a packaged semiconductor device 130 or semiconductor package 130 in accordance with another embodiment. Semiconductor package 130 includes bottom frame 13 having die attach pad 27 and top frame 120 with leadfinger 118 directly attached to one of die pads 25 corresponding to power device portion 191 of semiconductor device 19. In one embodiment, semiconductor device 19 attached to die attach pad 27 using die attach material 20 as described previously or by other materials as known to those of skill in the art. Semiconductor package 130 is illustrated after singulation to remove side segments 116 and 21 from conductive frame structure 111.

Package body 36 covers or encapsulates at least portions of leadfinger 118, at least a portion of support lead 24 and recessed portion 1180, and at least a portion of the semiconductor device 19. In accordance with the present embodiment, other portions of support leads 24 and leads 22 (as shown, for example, in FIG. 2) are exposed to the outside of semiconductor package 130 through package body 36 for connecting semiconductor package 130 to a next level of assembly. In accordance with the present embodiment, a portion of top surface 68 of leadfingers 118 is exposed to the outside through an upper surface of package body 36. The exposure of top surface 68 can be done using, for example, grinding or other mechanical removal processing, film assist molding techniques, masking and etching techniques, or other techniques as known to those of skill in the art. In some embodiments, the exposed upper surfaces of leadfingers 118 advantageously provide additional thermal dissipation. In other embodiments, a heat sink structure may be attached to the exposed leadfingers to further improve thermal dissipation. It is understood that other embodiments described herein may have the leadfingers similarly configured. In embodiments where portions of the leadfingers are exposed in package body 36, it is preferred that conductive connective structures 26 have a lower height so that they remain covered by package body 36.

In accordance with the present embodiment, recessed portion 1181 is configured to accommodate semiconductor device 19 below a portion of leadfinger 118 and to directly attach to semiconductor device 19 as generally illustrated in FIG. 18. In some embodiments, the thickness of semiconductor device 19 may be thinned or the overall package height increased, or both. In other embodiments, the space between leadfinger 118 and die attach pad 27 can be determined by the bond thickness of die attach material 20 or by additional masking and etching techniques to reduce the thickness of the die attach pad 27 below the top surface of side segment 21 of bottom frame 13.

Figure 19:
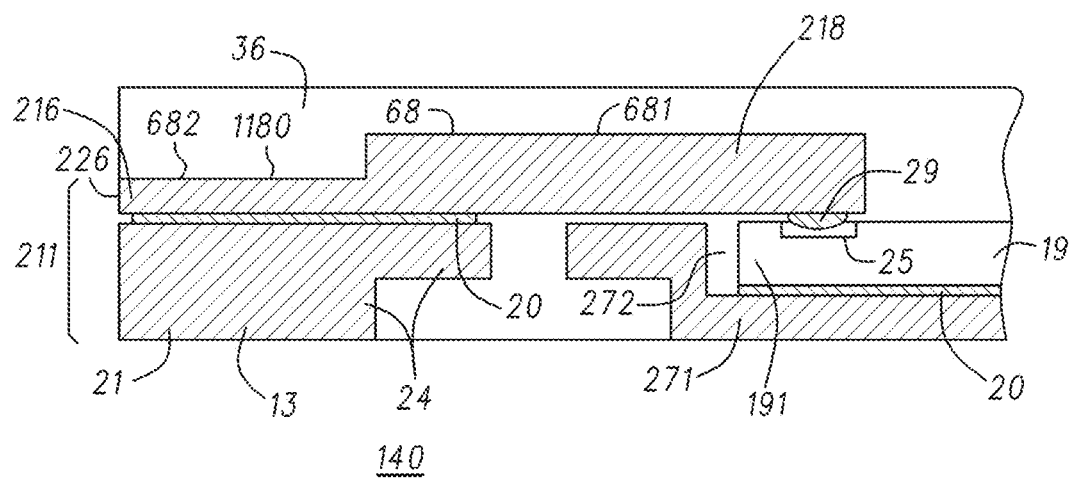
FIG. 19 illustrates a partial cross-sectional view of a semiconductor package having another conductive frame structure in accordance with an embodiment of the present invention.

FIG. 19 illustrates a partial cross-sectional view of a packaged semiconductor device 140 or semiconductor package 140 having another conductive frame structure 211 in accordance with a further embodiment. In the present embodiment, bottom frame 13 comprises a different die attach pad 271 or die pad 271 configuration. More particularly, die attach pad 271 comprises a recess 272, recessed portion 272, or well portion 272 extending from an upper surface partially inward or downward into die attach pad 271. In accordance with the present embodiment, recess 272 is configured for receiving semiconductor device 19. In one embodiment, semiconductor device 19 is partially recessed within recess 272 such that an upper portion of semiconductor device 19 extends vertically above the top surface of die attach pad 271. Recess 272 can be a half-etched region formed using masking and etching techniques, and the dimensions of 272 can be varied depending upon device performance requirements.

In the present embodiment, top frame 226 includes one or more leadfingers 218 extending inward from side segments 216 towards semiconductor device 19. In accordance with the present embodiment, leadfinger 218 is configured to directly attach to bond pad 25 of semiconductor device 19 corresponding to a power device portion 191. In one embodiment, leadfinger 218 comprises recessed portion 1180, which has the benefit of reducing the metal thickness in that portion of semiconductor package 140 that will be singulated or separated thereby reducing wear of the singulating tool. Additionally, this minimizes any premature separation of the frames during singulation and minimizes the opportunities for micro-cracking type defects. As illustrated in FIG. 19, leadfinger 218 includes a leadfinger top surface 68 having a first top surface segment 681 and a second top surface segment 682 and the first top surface segment 681 resides on a different plane (e.g., a horizontal plane) than the second top surface segment 682. In semiconductor package 140 leadfinger 218 is substantially planar with the upper surface of semiconductor device 19. In the present embodiment, the space between leadfinger 218 and die attach pad 271 can be determined either by the bond thickness of the die attach material 20 or by additional etching techniques using a photolithographic masking processes to reduce the surface of the die attach pad 271 below the top surface of side segment 21 of bottom frame 13. Package body 36 covers or encapsulates at least portions of leadfinger 218, at least a portion of support lead 24 and recessed portion 1180, and at least a portion of the semiconductor device 19. In accordance with the present embodiment, other portions of support leads 24 and leads 22 (as shown, for example, in FIG. 2) are exposed to the outside of semiconductor package 140 through package body 36 for connecting semiconductor package 140 to a next level of assembly.

Figure 20:
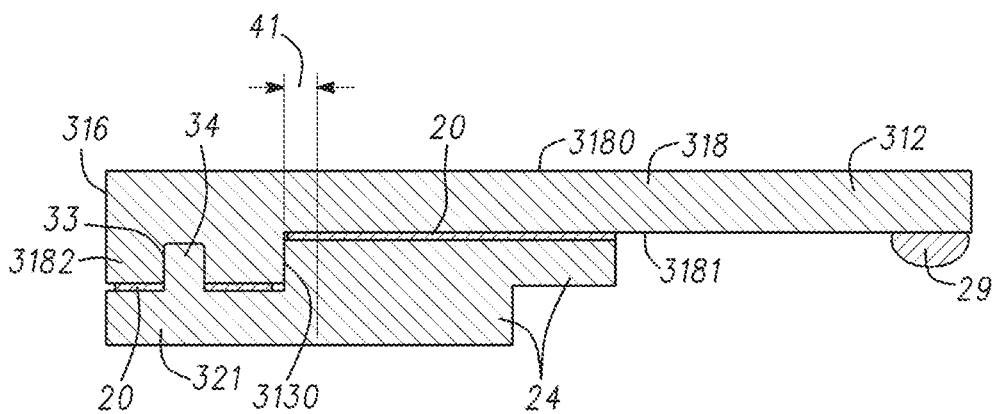
FIG. 20 illustrates a partial cross-sectional view of a conductive frame structure in accordance with a further embodiment of the present invention.

FIG. 20 illustrates a partial cross-sectional view of a conductive frame structure 311 in accordance with a further embodiment. In the present embodiment, conductive frame structure 311 comprises a top frame 312 having a side segment 316 and one or more leadfingers 318 extending inward from side segment 316. Conductive frame structure 311 further comprises a bottom frame structure 313 having a side segment 321 and a support lead 324. In accordance with the present embodiment, leadfinger 318 has a top surface 3180 having a generally planar configuration and a bottom surface 3181 that includes a protruding portion 3182 disposed proximate to side segment 316. In one embodiment, protruding portion 3182 is configured with alignment feature 33, which can be a recessed portion or partial hole as generally illustrated in FIG. 20. Bottom frame 313 comprises support leads 24 extending inward from side segment 321 and leads 22 (as shown, for example, in FIG. 2) as described previously. Also in accordance with the present embodiment, bottom frame 313 comprises a recessed portion 3130 disposed proximate to side segment 321 for attaching or joining with protruding portion 3182. In one embodiment recessed portion 3130 is configured with alignment feature 34 for joining with alignment feature 33. In this embodiment, alignment feature 34 is configured as a protruding portion. Singulation street 41 is illustrated as an example of where side segments 316 and 321 may be removed from frame structure 311 during the fabrication of semiconductor packages in accordance with the present embodiments. The present embodiment is useful, for example, in configurations where it is desired for the leadfinger to be planar with the surface of the die attach pad. As in previous embodiments, the tip of leadfinger 318 may be provided with a conductive joining material 29 for directly attached to the semiconductor device.

Figure 21:
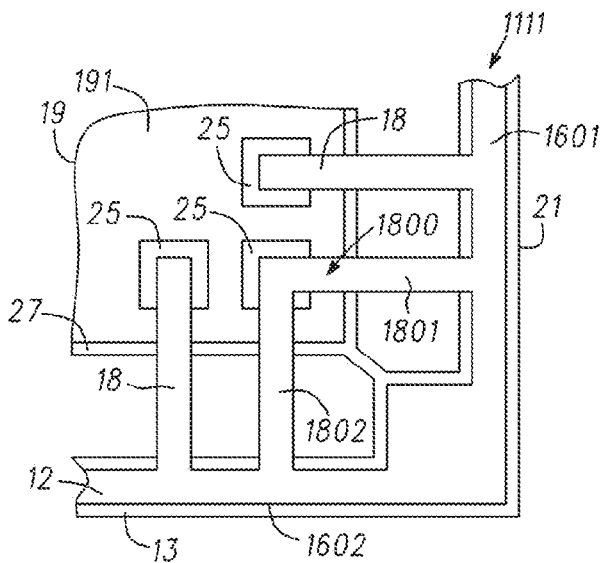
FIG. 21 illustrates a partial top view of a conductive frame structure in accordance with another embodiment of the present invention.

FIG. 21 illustrates a partial cross-sectional view of a conductive frame structure 1111 in accordance with another embodiment. Conductive frame structure 1111 is similar to conductive frame structures 11 and 111 and only the differences will be described hereinafter. In the present embodiment, conductive frame structure 1111 includes a common leadfinger 1800 having a first leadfinger portion 1801 extending from a first side 1600 of top frame 12 and a second leadfinger portion 1802 extending from a second side 1602 of top frame 12. In accordance with the present embodiment, first leadfinger portion 1801 and second leadfinger portion 1802 are adjacent different sides of semiconductor device 19 and are configured to provide a common lead structure electrically connected to one of bond pads 25 overlying semiconductor device 19 as generally illustrated in FIG. 21. More particularly, conductive frame structure 1111 comprises common leadfinger 1800 configured to electrically connect a bond pad 25 to more than one I/O leads of the packaged semiconductor device.

Figure 22:
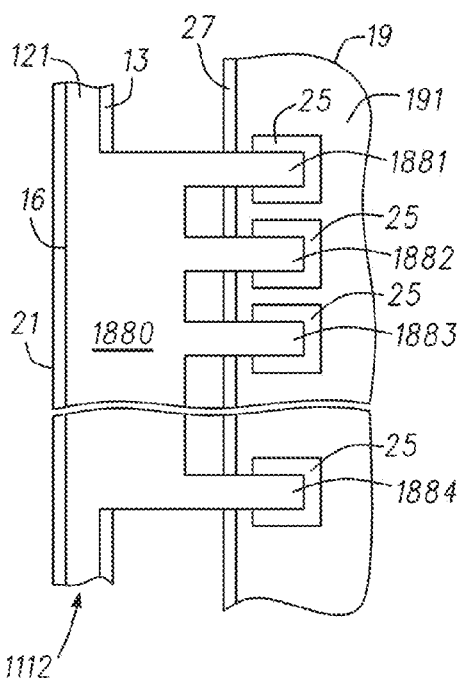
FIG. 22 illustrates a partial top view of a conductive frame structure in accordance with a further embodiment of the present invention.

FIG. 22 illustrates a partial top view of a conductive frame structure 1112 in accordance with a further embodiment. Conductive frame structure 1112 is similar to conductive frame structures 11, 111, and 1111 and only the differences will be described hereinafter. In the present embodiment, conductive frame structure 1112 comprises a top frame 121 having a ganged leadfinger 1880 or a leadfinger 1880 having multiple lead finger portions, such as a first leadfinger portion 1881, second leadfinger portion 1882, third leadfinger portion 1883, and fourth leadfinger portion 1884. In accordance with the present embodiment, the multiple leadfinger portions are physically connected or ganged together by leadfinger 1880 to provide a common electrical connection. More particularly, conductive frame structure 1112 includes one or more leadfingers 1880 that provide electrical connection to more than one conductive structure 25 on semiconductor device 19. In one embodiment, fourth leadfinger portion 1884 may be spaced further apart from third leadfinger portion 1883 compared to the spacing between third leadfinger portion 1883 and second leadfinger portion 1882. In some embodiments, other conductive structures 25 in between third leadfinger portion 1883 and fourth leadfinger portion 1884 can be connected to other leads (e.g., leads 22) using conductive connective structures 26. By way of example, in such embodiments fourth leadfinger portion 1884 can be connect to third leadfinger portion 1883 using a conductive bridge interconnect that is spaced apart (e.g., vertically) from any intervening leads (e.g., leads 22).

Figure 23:
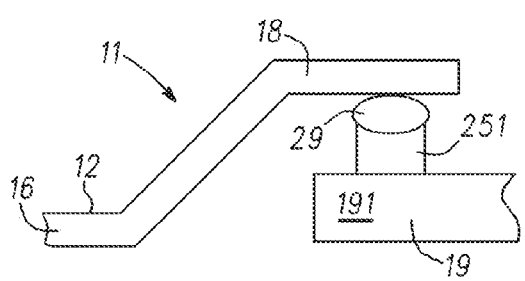
FIG. 23 illustrates a partial side view of a conductive frame structure bonded to a conductive pillar in accordance with an embodiment of the present invention.

FIG. 23 illustrates a partial side view of conductive frame structure 11 including top frame 12 and leadfinger 18 attached to power device portion 191 of semiconductor device 19. In accordance with the present embodiment, leadfinger 18 is directly attached to a conductive pillar structure 251 disposed overlying a major surface of semiconductor device 19. In one embodiment, conductive pillar structure 251 is disposed over a conductive pad 25 with conductive pad 25 comprising, for example, an under bump material. In one embodiment, conductive joining material 29 directly joins leadfinger 18 to conductive pillar structure 251. By way of example, conductive pillar structure 251 comprises a metal material, such as copper, a copper alloy, or other conductive materials as known to those of skill in the art. Conductive pillar structure 251 can be formed using, for example, plating or deposition techniques or other techniques as known to those of skill in the art. In one preferred embodiment, conductive pillar structure 251 provides a standoff in a range from approximately 50 µm through 70 µm from the surface of semiconductor device 19. In accordance with the present embodiment, conductive pillar structure 251 provides an added benefit of a self-planarizing process thereby compensating for any variations in conductive frame structure 11 or in handling during manufacturing. It is understood that the embodiments of FIGS. 21-23 may be used in any combination with any of the other embodiments described herein.

From all of the foregoing, one skilled in the art can determine that in accordance with one embodiment, a method of making a packaged semiconductor device comprises providing a conductive frame structure comprising: a first frame having a first side segment and a leadfinger extending inward from the first side segment; and a second frame having a second side segment and a plurality of leads extending inward from the second side segment. The method includes providing a semiconductor device having a power device portion electrically coupled to a first conductive pad and a logic device portion electrically coupled to a second conductive pad. The method includes attaching the leadfinger to the first bond pad. The method includes attaching a conductive structure to the second conductive pad and a first lead. The method includes forming a package body covering the conductive structure, at least portions of the leadfinger, at least a portion of the first lead, and at least a portion of the packaged semiconductor device. The method includes removing the first side segment and the second side segment.

In another embodiment, providing the conductive frame structure can comprise providing a second lead coupled to a portion of the leadfinger distal to the first conductive pad. In a further embodiment, providing the conductive frame structure can comprise providing the leadfinger having a leadfinger top surface having a first top surface segment and a second top surface segment, the first top surface segment residing on a different plane than the second top surface segment.

From all of the foregoing, one skilled in the art can determine that in accordance with one embodiment, a conductive frame structure comprises a first frame having a first side segment and a leadfinger extending inward from the first side segment, the leadfinger having a leadfinger top surface having a first top surface segment and a second top surface segment, the first top surface segment residing on a different plane than the second top surface segment; and a second frame having a second side segment and a plurality of leads extending inward from the second side segment, wherein a first lead is attached to a portion of the leadfinger, and wherein the second lead is configured for receiving a conductive structure separate from the first frame, and wherein the first frame and the second frame are attached together.

From all of the foregoing, one skilled in the art can determine that in accordance with another embodiment the second frame may further comprise a die attach pad. In a further embodiment, the die attach pad may comprise a recessed portion configured for receiving a semiconductor device. In a still further embodiment, the leadfinger may have a bent shape. In another embodiment, the leadfinger may have a recessed portion defining the second top surface segment. In a further embodiment, the structure may further comprise a first alignment structure disposed in the first frame; and a second alignment structure disposed in the second frame and engaged with the first alignment feature. In a still further embodiment, the second side segment may comprise a recessed portion. In another embodiment, the structure may comprise a stress-relief structure disposed in the first frame. In a further embodiment, the first frame may be attached to the second frame with a conductive material.

In view of all of the above, it is evident that a novel method manufacturing semiconductor packages having high current capacity and high thermal capacity leadfingers and other types of conductive connective structures have been disclosed. Included, among other features, are a conductive frame structure having a first frame structure having a side segment and one or more leadfingers extending inward from the side segment towards a central portion of the conductive frame structure. The leadfingers are configured for directly attaching to a semiconductor device, such as power integrated circuit device. Also, in some embodiments the conductive frame structure further includes a second frame having a side segment and a plurality of leads extending inward from the side segment. The second frame is configured for attaching the first frame and the plurality of leads are configured to electrically connect to other portions of the semiconductor device, for example, those portions that do not require high current carrying capability. In some embodiments, photolithographic and etch techniques are used to provide the first frame with reduced leadfinger pitches and corner radiuses to support semiconductor device with tight interconnect requirements. In some embodiments, the conductive frame structure includes alignment features and stress-relief features to assist in manufacturing. The side segments of the conductive frame structure can be removed using a singulation process to isolate the leadfingers and leads.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, the structures and elements described herein can be used with substrates including laminate substrates and other substrates that having a die attach pad and use molded body structures. Although the present description primarily used a QFN/MLF or QFP leadframe substrate in the described embodiments, it is understood that applying these concepts to other leadframe devices as well as a laminate substrate design is possible, providing the same or similar benefits. In the case of a laminate design, a leadframe may still be utilized to enable the conductive leadfinger formation and interconnect to the device mounted on a laminate substrate.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method of making a packaged semiconductor device comprising:
providing a conductive frame structure comprising:
a first frame having a first side segment and a leadfinger extending inward from the first side segment; and
a second frame having a second side segment and a first lead extending inward from the second side segment;
providing a semiconductor device having a major surface, the major surface including a first conductive structure and a second conductive structure;
placing the leadfinger and the first conductive structure into contact to provide an electrical connection;
attaching a conductive connective structure to the second conductive structure and the first lead;
forming a package body covering the conductive connective structure, at least portions of the leadfinger, at least a portion of the first lead, and at least a portion of the semiconductor device; and
removing the first side segment and the second side segment.

2. The method of claim 1, wherein:
providing the conductive frame structure comprises providing the second frame with a second lead extending inward from the second side segment, wherein the second lead is disposed adjoining at least a portion of the leadfinger; and
placing the leadfinger comprises placing a leadfinger having a first leadfinger portion providing the electrical connection to the first conductive structure and a second leadfinger portion providing another electrical connection to a third conductive structure disposed adjacent the major surface of the semiconductor device.

3. The method of claim 1, wherein:
providing the semiconductor device comprises a providing a semiconductor device having a power portion electrically coupled to the first conductive structure and a logic portion electrically coupled to the second conductive structure; and
placing the leadfinger comprises attaching a common leadfinger comprising:
a first leadfinger portion extending from the first side segment to the first conductive structure; and
a second leadfinger portion extending from a different side segment adjacent to the first side segment to the first conductive structure.

4. The method of claim 1, wherein providing the conductive frame structure comprises providing the leadfinger comprising a leadfinger top surface having a first top surface segment and a second top surface segment, the first top surface segment residing on a different plane than the second top surface segment.

5. The method of claim 4, wherein:
providing the conductive frame structure comprises providing the leadfinger having a bent shape; and
providing the semiconductor device comprises providing the first conductive structure comprising a conductive pillar structure.

6. The method of claim 1, wherein:
providing the conductive frame structure comprises providing the second frame having a die attach pad; and
providing the semiconductor device comprises attaching the semiconductor device to the die attach pad before placing the leadfinger and the first conductive structure into contact.

7. The method of claim 1, wherein:
providing the conductive frame structure comprises providing the leadfinger having a conductive joining material disposed on an end distal to the first side segment; and providing the semiconductor device comprises providing the first conductive structure comprising a first conductive pillar structure.

8. A method for forming a packaged semiconductor device comprising:
providing a conductive frame structure comprising a leadfinger extending inward from a first side segment and a first lead, wherein the leadfinger comprises a leadfinger top surface having a first top surface segment and a second top surface segment, the first top surface segment residing on a different plane than the second top surface segment;
providing a semiconductor device having a major surface, the major surface including a first conductive structure and a second conductive structure;
attaching the leadfinger to the first conductive structure;
attaching a conductive connective structure to the second conductive structure and the first lead;
forming a package body encapsulating the conductive connective structure, at least portions of the leadfinger, at least portions of the first lead, and at least a portion of the semiconductor device; and
removing the first side segment.

9. The method of claim 8, wherein:
providing the conductive frame structure comprises:
providing a first frame having the first side segment and the leadfinger extending inward from the first side segment; and
providing a second frame having a second side segment and the first lead extending inward from the second side segment; and
removing comprises removing the first side segment, the second side segment, a portion of the first lead, and a portion of the second lead that are exposed outside the packaged semiconductor device.

10. The method of claim 9, wherein:
providing the conductive frame structure comprises:
providing the first frame with a first alignment structure; and
providing the second frame with a second alignment structure engaged with the first alignment structure at least during the attaching of the leadfinger;
providing the first frame comprises providing a leadfinger having a first leadfinger portion and a second leadfinger portion; and
attaching the leadfinger comprises attaching the first leadfinger portion to the first conductive structure and the second leadfinger portion to a third conductive structure disposed adjacent the major surface of the semiconductor device.

11. The method of claim 9, wherein:
providing the second frame comprises providing a second lead coupled to a portion of the leadfinger distal to the first conductive structure; and
providing the semiconductor device comprises providing the first conductive structure comprising a conductive pillar structure.

12. The method of claim 9, wherein providing the conductive frame structure comprises providing a die attach pad, and wherein providing the semiconductor device comprises attaching the semiconductor device to the die attach pad.

13. The method of claim 8, wherein:
providing the semiconductor device comprises providing a semiconductor device having a power device portion electrically coupled to the first conductive structure and a logic device portion electrically coupled to the second conductive structure; and
attaching the leadfinger comprises attaching a common leadfinger comprising:
a first leadfinger portion extending from the first side segment to the first conductive structure; and
a second leadfinger portion extending from a different side segment adjacent to the first side segment to the first conductive structure.

14. A method for forming a packaged semiconductor device comprising:
providing a first frame having a first side segment and a leadfinger extending inward from the first side segment, wherein the leadfinger comprises a leadfinger top surface having a first top surface segment and a second top surface segment, the first top surface segment residing on a different plane than the second top surface segment;
providing a second frame having a second side segment and a first lead extending inward from the second side segment;
providing a semiconductor device having a major surface, the major surface including a first conductive structure and a second conductive structure;
attaching the leadfinger to the first conductive structure;
attaching a conductive connective structure to the second conductive structure and the first lead;
forming a package body encapsulating the conductive connective structure, at least portions of the leadfinger, at least portions of the first lead, and at least a portion of the semiconductor device; and
removing the first side segment and the second side segment.

15. The method of claim 14, wherein:
providing the first frame comprises providing a first alignment structure;
providing the second frame comprises providing a second alignment structure; and
the method further comprises engaging the second alignment structure with the first alignment structure at least during the step of attaching of the leadfinger.

16. The method of claim 14, wherein:
providing the first frame comprises providing a die attach pad;
providing the second frame comprises providing a second lead supporting a portion of the leadfinger distal to the first conductive structure; and
providing the semiconductor device comprises attaching the semiconductor device to the die attach pad.

* * * * *